(12) United States Patent
Lambert

(10) Patent No.: US 10,312,661 B2
(45) Date of Patent: Jun. 4, 2019

(54) III-V CHIP PREPARATION AND INTEGRATION IN SILICON PHOTONICS

(71) Applicant: Skorpios Technologies, Inc., Albuquerque, NM (US)

(72) Inventor: Damien Lambert, Los Altos, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/592,704

(22) Filed: May 11, 2017

(65) Prior Publication Data

US 2017/0331248 A1 Nov. 16, 2017

Related U.S. Application Data

(60) Provisional application No. 62/334,895, filed on May 11, 2016.

(51) Int. Cl.
| | |
|---|---|
| *H01S 5/022* | (2006.01) |
| *G02B 6/42* | (2006.01) |
| *H01L 23/00* | (2006.01) |
| *G02B 6/136* | (2006.01) |
| *G02B 6/122* | (2006.01) |
| *G02B 6/12* | (2006.01) |
| *H01S 5/02* | (2006.01) |

(52) U.S. Cl.
CPC ............ *H01S 5/0226* (2013.01); *G02B 6/122* (2013.01); *G02B 6/136* (2013.01); *G02B 6/4201* (2013.01); *H01L 24/03* (2013.01); *H01S 5/02268* (2013.01); *H01S 5/02296* (2013.01); *G02B 2006/12097* (2013.01); *H01S 5/0217* (2013.01); *H01S 5/0224* (2013.01); *H01S 5/02272* (2013.01); *H01S 2301/176* (2013.01)

(58) Field of Classification Search
None
See application file for complete search history.

(56) References Cited

U.S. PATENT DOCUMENTS

| | | | | |
|---|---|---|---|---|
| 5,780,875 | A * | 7/1998 | Tsuji ................... | G02B 6/4224 257/81 |
| 6,393,171 | B2 * | 5/2002 | Sasaki ...................... | G02B 6/42 385/14 |
| 7,583,873 | B2 * | 9/2009 | Oki ....................... | G02B 6/1221 156/182 |
| 8,615,025 | B2 | 12/2013 | Dallesasse et al. | |
| 8,630,326 | B2 | 1/2014 | Krasulick et al. | |
| 9,097,846 | B2 | 8/2015 | Mizrahi et al. | |

(Continued)

OTHER PUBLICATIONS

PCT/US2017/032189 filed May 11, 2017 received an ISR/WO mailed Jul. 28, 2017, 9 pages.

(Continued)

*Primary Examiner* — Michelle R Connelly
(74) *Attorney, Agent, or Firm* — Kilpatrick Townsend & Stockton LLP

(57) ABSTRACT

A composite semiconductor laser is made by securing a III-V wafer to a transfer wafer. A substrate of the III-V wafer is removed, and the III-V wafer is etched into a plurality of chips while the III-V wafer is secured to the transfer wafer. The transfer wafer is singulated. A portion of the transfer wafer is used as a handle for bonding the chip in a recess of a silicon device. The chip is used as a gain medium for the semiconductor laser.

15 Claims, 14 Drawing Sheets

(56) References Cited

U.S. PATENT DOCUMENTS

| | | | |
|---|---|---|---|
| 9,209,142 B1* | 12/2015 | Lambert | H01L 24/03 |
| 9,252,564 B2 | 2/2016 | Chaouch et al. | |
| 9,316,785 B2 | 4/2016 | Krasulick et al. | |
| 9,882,073 B2* | 1/2018 | Krasulick | H01L 31/02327 |
| 9,991,149 B2* | 6/2018 | Lambert | H01L 24/03 |
| 2006/0057836 A1 | 3/2006 | Nagarajan et al. | |
| 2006/0093002 A1* | 5/2006 | Park | G02B 6/4232 |
| | | | 372/46.01 |
| 2006/0246636 A1* | 11/2006 | Imai | H01L 27/1214 |
| | | | 438/149 |
| 2011/0086461 A1 | 4/2011 | Bolis | |
| 2013/0122617 A1* | 5/2013 | Lott | H01S 5/0217 |
| | | | 438/27 |
| 2015/0104905 A1 | 4/2015 | Park et al. | |
| 2016/0133496 A1* | 5/2016 | Lambert | H01L 24/03 |
| | | | 257/619 |
| 2017/0227709 A1 | 8/2017 | Lambert | |
| 2017/0230117 A1 | 8/2017 | Li et al. | |

OTHER PUBLICATIONS

PCT/US2017/032189 received an Internaional Preliminary Report on Patentability dated Nov. 22, 2018, 6 pages.

* cited by examiner

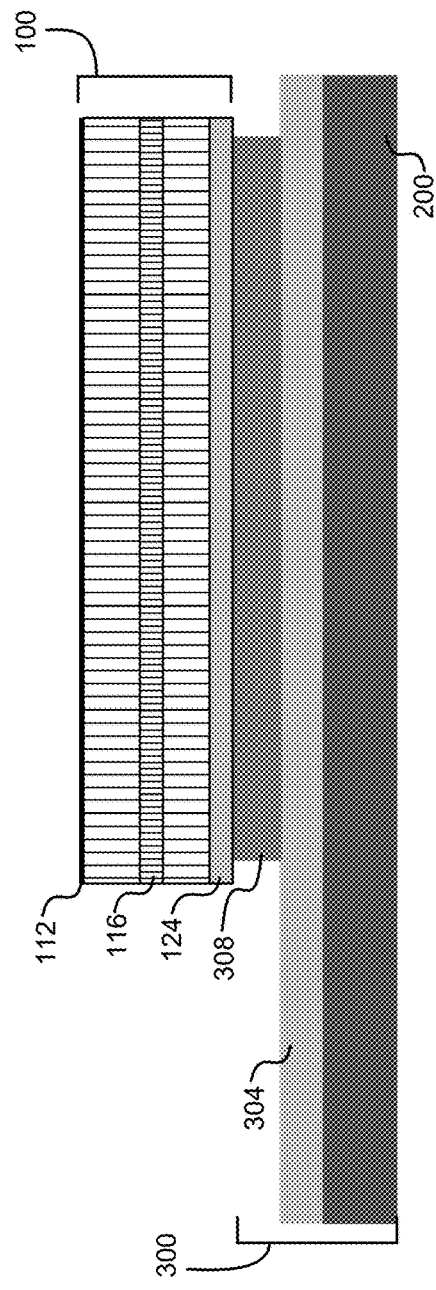
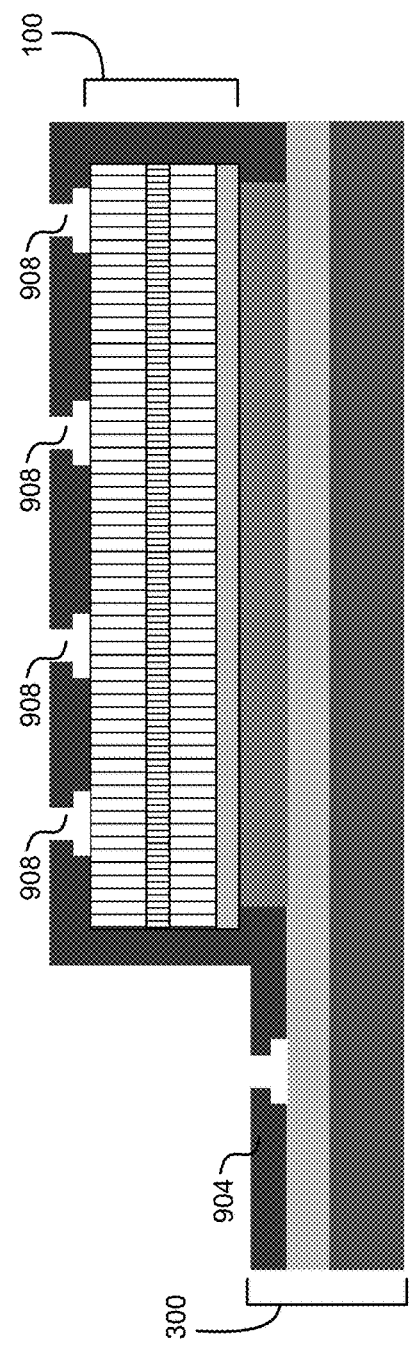

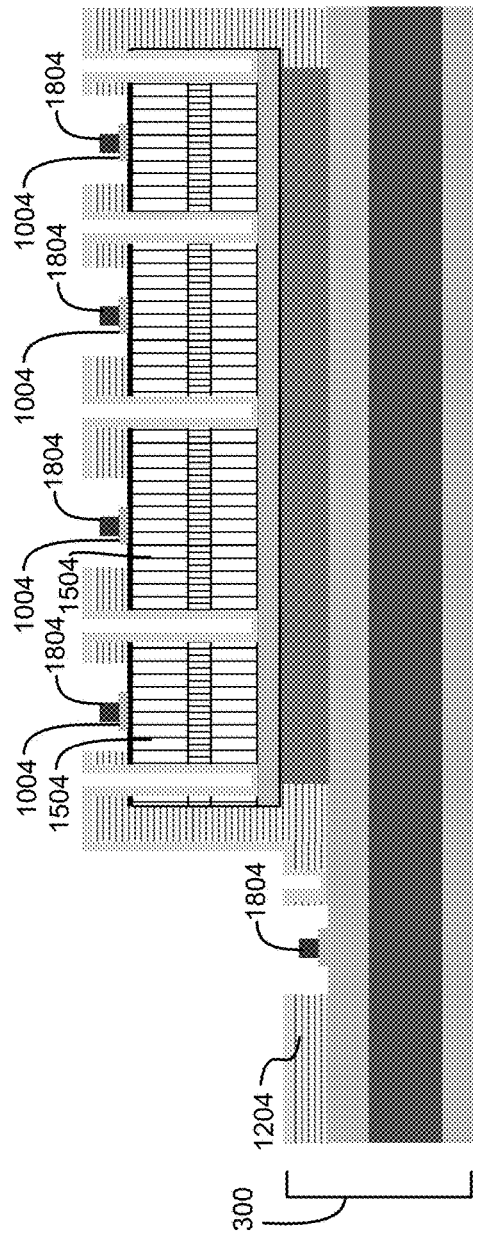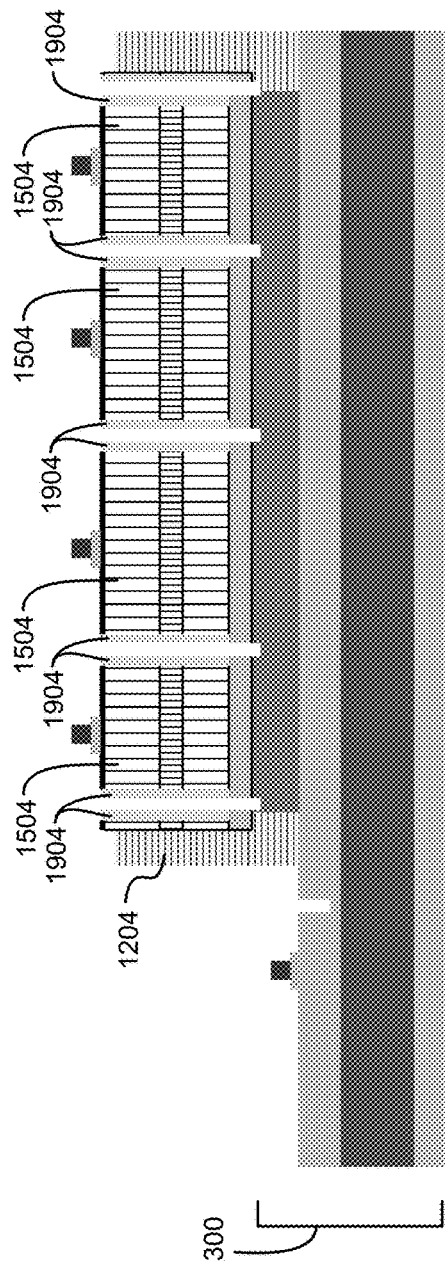

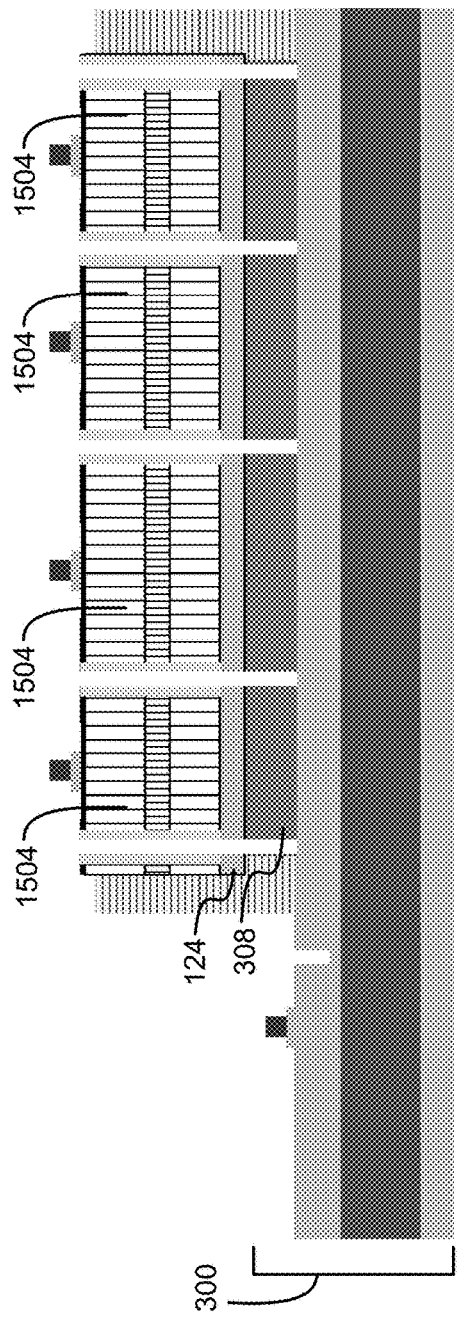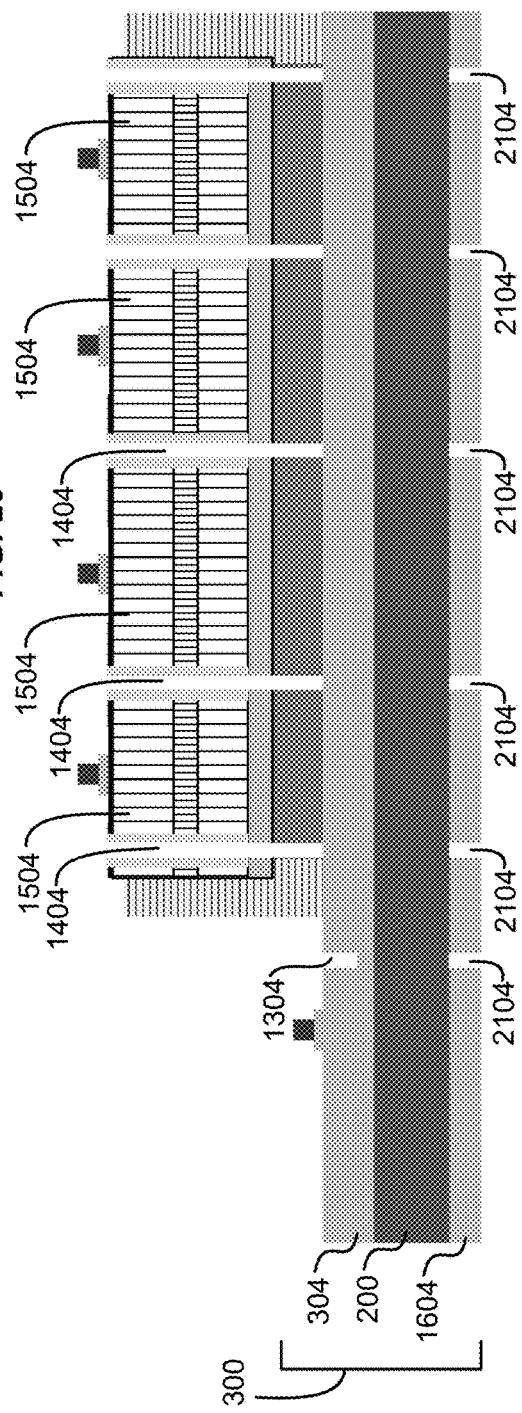
FIG. 20
FIG. 21

III-V CHIP PREPARATION AND INTEGRATION IN SILICON PHOTONICS

CROSS-REFERENCE TO RELATED APPLICATIONS

This application claims priority to U.S. Provisional Patent Application No. 62/334,895, filed on May 11, 2016, entitled "III-V Chip Preparation And Integration In Silicon Photonics," the disclosure of which is hereby incorporated by reference in its entirety for all purposes.

BACKGROUND

This application relates to semiconductor bonding for silicon photonics. More specifically, and without limitation, integrating a III-V chip with a silicon platform to create an optical device. Advanced electronic functions (e.g., photonic device bias control, modulation, amplification, data serialization and de-serialization, framing, and routing) are sometimes deployed on silicon integrated circuits. One reason for this is the presence of a global infrastructure for the design and fabrication of silicon integrated circuits that enables the production of devices having very advanced functions and performance at market-enabling costs. Silicon has not been useful for light emission or optical amplification due to its indirect-energy bandgap.

Compound semiconductors (e.g., indium phosphide, gallium arsenide, and related ternary and quaternary materials) have been used for optical communications, and in particular for light emitting devices and photodiodes because of their direct-energy bandgap. However, integration of advanced electrical functions on these materials has been limited to niche, high-performance applications due to higher costs of fabricating devices and circuits in these materials. Further, integration of ternary and quaternary materials with silicon is challenging because of lattice mismatch between materials.

BRIEF SUMMARY

In some embodiments, smaller III-V wafers are processed on a larger silicon wafer to reduce manufacturing costs. In some embodiments, defining location of facets of III-V chips uses photolithography and/or dry etch instead of cleaving, scribing, and/or dicing. In some embodiments, a size of a III-V chip is reduced, thus the size of the III-V chip is not constrained by cleaving, scribing, and/or dicing methods.

In some embodiments a method for creating a composite semiconductor laser by bonding a gain chip to a silicon device comprises: applying an adhesive to a transfer substrate to form a transfer wafer; securing a device wafer to the transfer wafer by contacting the device wafer to the adhesive; removing a portion of the device wafer after securing the device wafer to the transfer wafer; etching trenches in the device wafer to form a plurality of chips, wherein etching trenches is performed after removing the portion of the device wafer; etching trenches in the transfer substrate to singulate a chip unit, wherein the chip unit comprises: a chip of the plurality of chips, and a portion of the transfer wafer; aligning the chip with a target device after singulating the chip unit, wherein the portion of the transfer wafer is used as a handle to align the chip with the target device; bonding the chip to the target device; and removing a portion of the adhesive to disconnect the portion of the transfer wafer from the chip. In some embodiments, the device wafer is a III-V wafer, and the target device is a silicon device; etching the transfer substrate is performed after etching trenches in the device wafer; the device wafer comprises a back side, a front side, and an etch stop dividing the front side from the back side, the back side is a III-V substrate, the front side comprises an active region, the active region is a multi-quantum well structure, and removing the portion of the device wafer removes the back side of the device wafer; and/or the device wafer is a first wafer and the method further comprises: securing a second wafer to the adhesive, removing a portion of the second wafer after securing the second wafer to the adhesive, and etching trenches in the second wafer to form the plurality of chips, wherein etching trenches in the second wafer is performed after removing the portion of the second wafer. In some embodiments, the target device comprises: a device substrate comprising silicon, the device substrate forming a floor, a device layer comprising silicon, wherein: the device layer forms walls, a recess in the target device is defined by the floor and the walls, and an optical waveguide is formed in the device layer; aligning the chip with the silicon device comprises aligning the chip with the recess of the target device; the chip comprises: a facet, and an active region, the facet is an etched facet; and the active region of the chip is optically aligned with the optical waveguide in the device layer such that the composite semiconductor laser is configured to guide an optical beam from the active region of the chip, through the facet of the chip, through a wall of the device layer, and into the optical waveguide. In some embodiments, the method further comprises: comprising forming trenches in the adhesive; applying a stop layer, wherein the stop layer is between the transfer substrate and the adhesive; applying a passivation layer after etching trenches in the device wafer; and/or applying bond material to pads on the device wafer before singulating the chip unit.

In some embodiments, a semiconductor laser comprises: a target device, the target device comprising: a device substrate, the device substrate forming a floor, a device layer, wherein: the device layer forms walls, a recess in the target device is defined by the floor and the walls, and an optical waveguide is formed in the device layer; and a chip bonded in the recess to the floor of the device substrate, wherein: the chip comprises a facet, the facet is an etched facet, the chip comprises an active region, and the active region of the chip is optically aligned with the optical waveguide in the device layer so that the semiconductor laser is configured to guide an optical beam from the active region of the chip, through the facet of the chip, through a wall of the device layer, and into the optical waveguide. In some embodiments, the chip comprises a waveguide ridge to couple light out the facet, and the facet is not orthogonal to the waveguide ridge; the chip has a non-parallelogram shape or the etched facet is curved; the chip has a length equal to or greater than 0.1 µm and equal to or less than 15 µm, and the chip has a width equal to or greater than 0.1 µm and equal to or less than 15 µm; and/or the chip is garnet.

In some embodiments, a method for creating a composite device comprises: securing a first wafer to a transfer wafer; securing a second wafer to the transfer wafer; removing a portion of first wafer; removing a portion of the second wafer; etching the first wafer and the second wafer to form a plurality of chips, wherein etching is performed after removing the portion of the first wafer and after removing the portion of the second wafer; etching the transfer wafer to singulate a chip unit, wherein the chip unit comprises: a chip of the plurality of chips, and a portion of the transfer wafer; bonding the chip to a target device after singulating the chip unit, wherein the portion of the transfer wafer is used as a handle to align the chip with the target device; and removing the portion of the transfer wafer from the chip. In some embodiments, removing the portion of the first wafer and removing the portion of the second wafer are performed concurrently. In some embodiments the method further comprises: forming an optical bridge to optically couple an active region of the chip to a waveguide in the target device; applying metal to the first wafer and to the second wafer to form under-bump metallization pads on the first wafer and on the second wafer, wherein applying the metal is performed after securing the first wafer and the second wafer to the transfer wafer; and/or applying a dielectric layer to the first wafer, and securing the first wafer to the transfer wafer by contacting the dielectric layer of the first wafer to an adhesive on the second.

BRIEF DESCRIPTION OF THE DRAWINGS

FIG. 8 depicts a simplified cross section of an embodiment of the III-V wafer secured to the transfer wafer after removing a back side of the III-V wafer.

FIG. 9 depicts a simplified cross section of an embodiment of the III-V wafer secured to the transfer wafer after applying photoresist.

FIG. 18 depicts a simplified cross section of an embodiment of chips secured to the transfer wafer after applying bond material to the chips.

FIG. 19 depicts a simplified cross section of an embodiment of chips secured to the transfer wafer after removing a portion of the hard mask.

FIG. 20 depicts a simplified cross section of an embodiment of chips secured to the transfer wafer after forming trenches in an adhesive.

FIG. 21 depicts a simplified cross section of an embodiment of chips secured to the transfer wafer after etching a mask of the transfer wafer.

Figure 1:
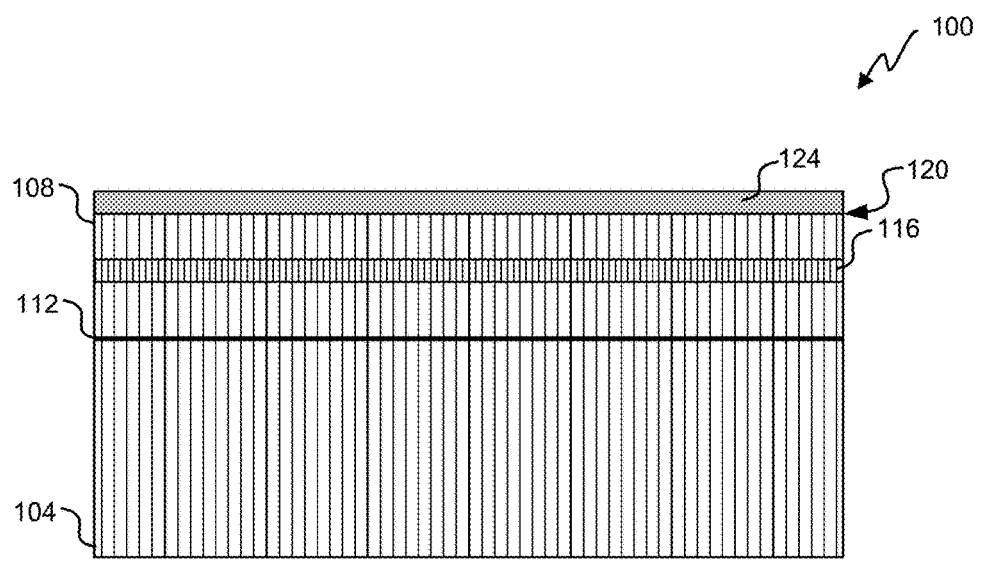
FIG. 1 depicts a simplified cross section of an embodiment of a III-V wafer.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The drawings are not to scale.

DETAILED DESCRIPTION

The description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments relate to preparing and/or integrating one or more III-V chips in silicon photonics. Silicon is useful for preparing photonics devices because of relative processing ease compared to other semiconductor materials. But silicon has an indirect bandgap. A direct bandgap is often more efficient for certain functions. For example, direct bandgap materials often make better optical emitters (e.g., used as a gain medium for a laser) and modulators. III-V chips (e.g., GaAs, InP, InGaAs, etc.) have a direct bandgap. By combining a III-V chip with silicon photonics, functions can be split between silicon and the III-V chip. Some embodiments are used to enable metallization on a III-V chip, to provide a handle (e.g., transfer wafer) for manipulating the III-V chip, and/or for relative ease of removing the handle (e.g., by dissolving a resin).

One or more III-V wafers are secured to a silicon transfer wafer (e.g., the III-V wafers are 3 inches in diameter and the silicon transfer wafer is 12 inches in diameter). A substrate of the III-V wafer(s) is removed, before defining chips in the III-V wafer(s). Chips in the III-V wafer(s) are formed by etching. Sides of the chips are covered (e.g., reduces oxidization). The transfer substrate is etched. A portion of the transfer substrate is used as a handle to manipulate a chip (e.g., to align the chip with a silicon device). The chip is bonded to a silicon device, and the portion of the transfer substrate is removed.

In some embodiments, one or more of the following are realized:

- A III-V substrate is removed without exposing sides of III-V chips to corrosive materials. The sides of the III-V chips are not yet defined when the III-V substrate is removed. Though edges of a III-V wafers are exposed, sides (facets) of III-V chips are not (e.g., edges of the III-V wafer are part of an un-processed exclusion zone of the III-V wafer).
- The III-V substrate is replaced with a new handle that can be removed later with solvents.
- III-V chips can be scaled down because a chip size is no longer defined by a cleaving and dicing process, but rather from a lithography and etch process.
- Sizes of chips are more precisely defined. The limitation on chip size is a photolithography tolerance (e.g., better than 0.1 µm with a good stepper/scanner), while cleaving/dicing has 20 to 50 µm registration inaccuracy.
- A passivation/protection layer (e.g., dielectric spacer) is applied (e.g., "self-aligned" since no alignment is needed to applying the passivation layer) to protect a chip (e.g., to protect an active region, such as multi-quantum wells) by covering facets of the chips. For example, the passivation layer protects facets/active material of chips from air/moisture/oxidation during bonding to a silicon photonics receiver.
- III-V chips can be made in nearly any shape. In dicing, III-V chips are normally limited to rectangular shapes. For example, an optical waveguide ridge can be formed along a crystal axis of the III-V chip while a facet of the III-V chip is not orthogonal to the waveguide ridge (reduces reflection).

Referring first to FIG. 1, an embodiment of a III-V wafer 100 is shown. The III-V wafer comprises a back side 104, a front side 108, and an etch stop 112 separating the back side 104 from the front side 108. The III-V wafer 100 has a diameter equal to or greater than two inches and equal to or less than 8 inches (e.g., 2, 3, 4, 5, or 6 inches). In some embodiments, the III-V wafer is between 200 µm and 1000 µm tall (thick) or between 300 µm and 700 µm thick.

The III-V wafer is sometimes referred to as a device wafer. Though III-V material is described for the device wafer, other materials could be used for the device wafer. For example, in some embodiments, a rare-earth crystal is used (e.g., garnet, such as MGL garnet to make optical isolators and/or circulators) and lithium niobite could be used to make modulators.

The back side 104 is a substrate or a portion of a substrate. In some embodiments, the substrate is InP or GaAs. The back side 104 has a thickness between 50 and 900 µm (e.g., 100, 200, 300, or 400 µm). Though some embodiments use III-V material, other material could be used (e.g., direct-bandgap material, semiconductor material, and/or II-VI material).

The front side 108 of the III-V wafer 100 comprises an active region 116 with electrical, optical, magnetic, and/or piezo-electric properties (e.g., an epitaxy region comprising quantum wells and/or a region for a modulator). In some embodiments, the front side 108 of the III-V wafer 108 has a thickness from 1 µm to 10 µm (e.g., 3, 4, 5, or 6 µm), measured between a front surface 120 of the front side 108 of the III-V wafer 100 and the etch stop 112.

In some embodiments, different III-V wafers are used for different elements. For example, a first III-V wafer has epitaxy layers (e.g., active region 116) for a gain media; a second III-V wafer has epitaxy layers (e.g., active region 116) for modulators.

The front surface 120 of the III-V wafer 100 is cleaned to remove native oxides and/or improve dielectric adhesion. In some embodiments, BOE (buffered oxide etch) and/or dilute HF (hydrofluoric acid) are used to clean the front surface 120 of the III-V wafer 100.

A front layer 124 is applied (e.g., deposited) to the front surface 120 of the III-V wafer 100. In some embodiments, the front layer 124 is a dielectric layer (e.g., $SiO_2$ or $SiN_x$). In some embodiments, the front layer 124 is between 0.1 µm and 0.5 µm thick (e.g., 0.2, 0.25, 0.275, 0.3, or 0.325 µm thick). In some embodiments, a low stress material is chosen (e.g., −20 to −50 MPa, compressive) for the front layer 124. In some embodiments, low stress material is used to help prevent a portion of the front side 108 from deforming, curling, and/or rolling (e.g., after the back side 104 of the III-V wafer 100 is removed).

Figure 2:
FIG. 2 depicts a simplified cross section of an embodiment a transfer substrate.

FIG. 2 depicts an embodiment of a transfer substrate 200. The transfer substrate 200 is a silicon wafer (e.g., crystalline silicon because of availability of silicon substrates and relative ease of processing silicon). In some embodiments, the transfer substrate 200 is made of other material. In some embodiments, the transfer substrate 200 is very flat and/or ultra-flat. In some embodiments, the transfer substrate 200 has a diameter (e.g., 6, 8, or 12 inches), which is greater than the diameter of the III-V wafer 100. In some embodiments, the transfer substrate 200 has a greater diameter than the III-V wafer 100 to make alignment easier, and/or to bond multiple III-V wafers 100 to one transfer wafer. In some embodiments, the transfer substrate 200 has a diameter equal to the III-V wafer 100 (e.g., +/−10%) to reduce material costs (e.g., less waste). Exposure tool alignment marks 204 are printed on the transfer substrate 200 (e.g., kerf lanes are added).

Figure 3:
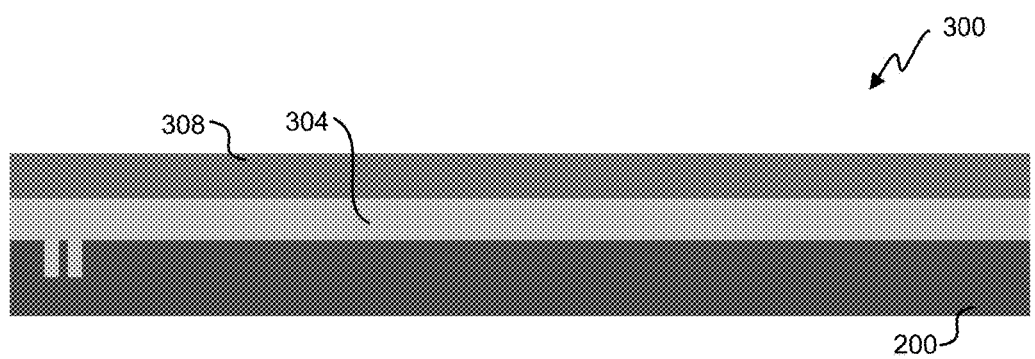
FIG. 3 depicts a simplified cross section of an embodiment a transfer wafer.

FIG. 3 depicts a simplified cross section of an embodiment a transfer wafer 300. The transfer wafer 300 comprises the transfer substrate 200, a stop layer 304, and an adhesive 308. In some embodiments, the stop layer 304 is not used.

The stop layer 304 is deposited on the transfer substrate 200. In some embodiments, the stop layer 304 is an oxide and/or a dielectric. For example, TEOS (tetraethylorthosilicate) is used as a silicon source to deposit a silicon oxide (e.g., $SiO_2$) on the transfer substrate 200. In some embodiments, the stop layer 304 is between 0.5 µm and 5.0 µm thick (e.g., 2, 3, 3.5 µm). In some embodiments, the stop layer 304 is used later for etching the transfer substrate 200. In some embodiments, a thickness of the stop layer 304 depends on Bosch process design rules/requirements (e.g., for etching through the transfer substrate for singulation). In some embodiments, the stop layer 304 is optional and may not be used for some Bosch-etch processes.

The adhesive 308 is applied to the transfer substrate 200 (e.g., on the transfer substrate 200; or on top of the stop layer 304, so that the stop layer 304 is between the transfer substrate 200 and the adhesive 308). In some embodiments, the adhesive 308 is from 1 µm to 10 µm and/or 2 µm to 5 µm thick. In some embodiments, DuPont/Hitachi Chemical HD MicroSystems, HD 3007 and/or 3010 resin is used for the adhesive 308. In some embodiments, thickness of the adhesive 308 depends on processing details. In some embodiments, the adhesive 308 is as thick as possible (e.g., based on a working thickness of resin as described by a manufacturer of the resin). In some embodiments, NMP (n-methylpyrrolidone) is used to dissolve the adhesive 308. The larger a surface area of the adhesive 308, the longer the NMP takes to dissolve the adhesive 308. However, the thicker the resin for a given surface area, the more quickly the resin dissolves.

Figure 4:
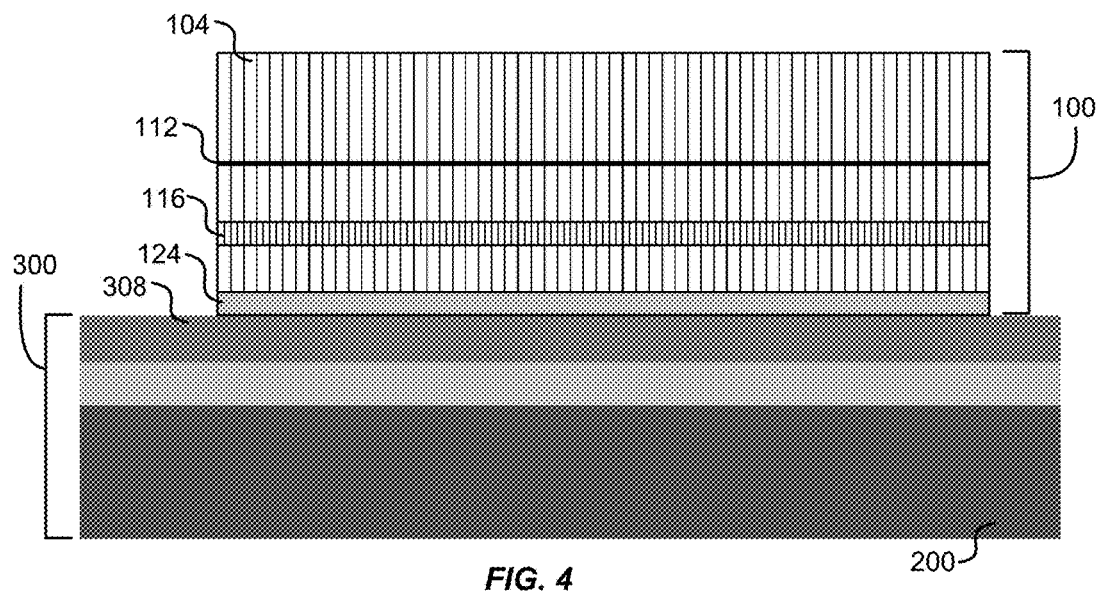
FIG. 4 depicts a simplified cross section of an embodiment of the III-V wafer secured to the transfer wafer.
Figure 5:
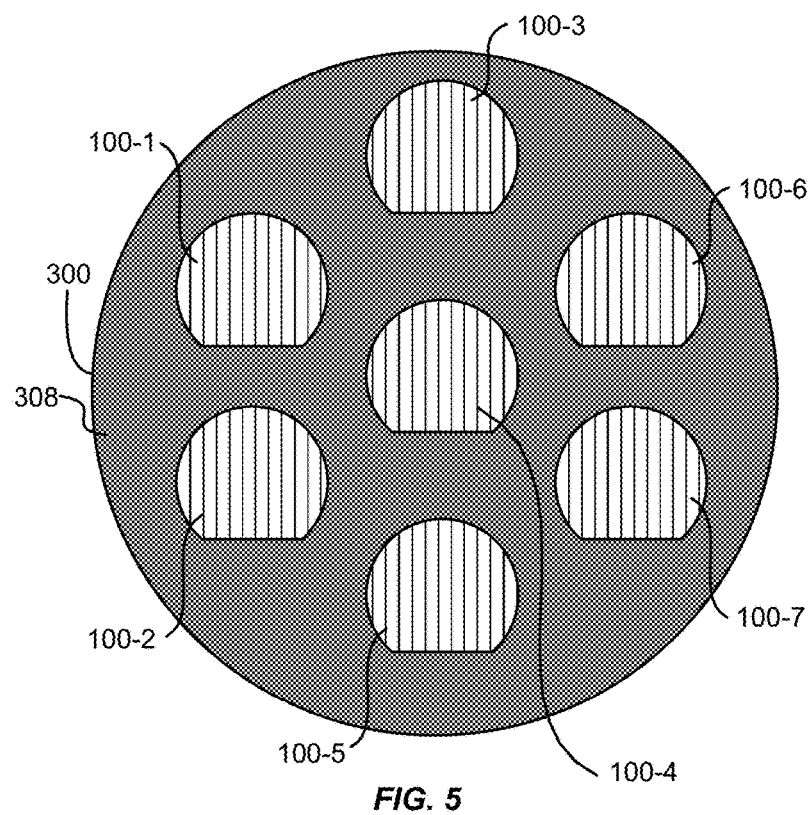
FIG. 5 depicts a simplified top view of an embodiment of the III-V wafer secured to the transfer wafer.

FIG. 4 depicts a simplified cross section of an embodiment of the III-V wafer 100 secured to the transfer wafer 300. FIG. 5 depicts a simplified top view of an embodiment of the III-V wafer 100 secured to a transfer wafer 300. One or more III-V wafers 100 are secured to the transfer wafer 300 (e.g., 1 to 15 III-V wafers 100 secured to the transfer wafer 300). In FIG. 5, a first III-V wafer 100-1, a second III-V wafer 100-2, a third III-V wafer 100-3, a fourth III-V wafer 100-4, a fifth III-V wafer 100-5, a sixth III-V wafer 100-7, and a seventh III-V wafer 100-7 are secured to the transfer wafer 300.

A III-V wafer 100 is secured to the transfer wafer 300 by "flipping" the III-V wafer 100 so that the front layer 124 of the III-V wafer 100 contacts the adhesive 308 of the transfer wafer 300. The adhesive 308 secures the III-V wafer 100 to the transfer wafer 300. In some embodiments, III-V wafers 100 secured to the transfer wafer 300 have similar types of active regions 116 (e.g., all III-V wafers 100 have an active region 116 for a gain medium for a laser or all III-V wafers 100 have an active region 116 for a modulator). In some embodiments, III-V wafers 100 secured to the transfer wafer 300 have different types of active regions 116 (e.g., one or more have an active region 116 for a gain medium and one or more have an active region 116 for a modulator).

In some embodiments, the adhesive 308 is cured (e.g., applying pressure to the transfer wafer 300, applying pressure to the III-V wafer(s) 100, and/or applying heat).

Figure 6:
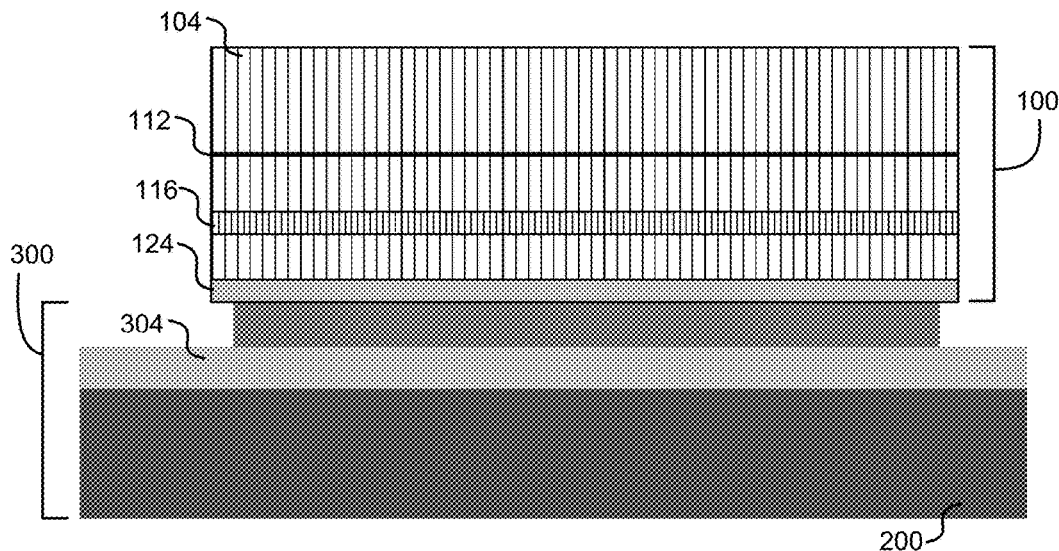
FIG. 6 depicts a simplified cross section of an embodiment of the III-V wafer secured to the transfer wafer after removing a first portion of an adhesive.
Figure 7:
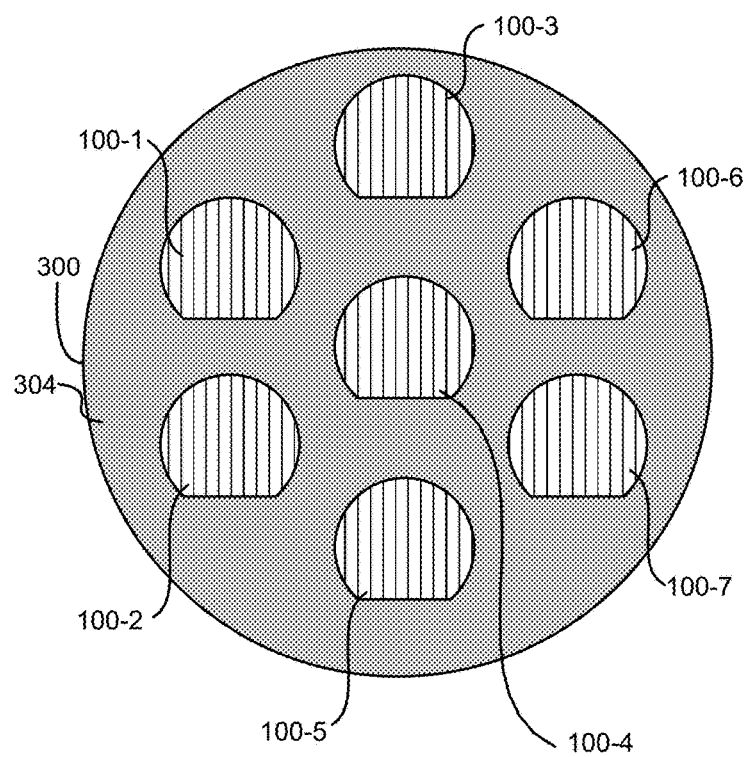
FIG. 7 depicts a simplified top view of an embodiment of the III-V wafer secured to the transfer wafer after removing the first portion of the adhesive.

FIG. 6 depicts a simplified cross section of an embodiment of the III-V wafer 100 secured to the transfer wafer 300 after removing a first portion of the adhesive 308. FIG. 7 depicts a simplified top view of an embodiment of the III-V wafer 100 secured to the transfer wafer 300 after removing the first portion of the adhesive 308. Adhesive 308 that is not between the III-V wafer 100 and the transfer wafer 300, sometimes referred to as the first portion of the adhesive 308, is removed. In some embodiments, NMP is used to soak the transfer wafer 300. In some embodiments, the adhesive will be under cut at edges of the III-V wafers 100. In some embodiments, oxygen plasma is used to remove the first portion of the adhesive 308.

FIG. 8 depicts a simplified cross section of an embodiment of the III-V wafer 100 secured to the transfer wafer 300 after removing the back side 104 of the III-V wafer 100. The back side 104 of the III-V wafer 100 is removed. In some embodiments, selective etchants are used to remove back sides 104 of the III-V wafers 100. For example, for back sides 104 comprising InP, HBr:Acetic (1:1), HCl:H3PO4 (1:2), and/or HCl are used. In some embodiments, the back sides 104 of the III-V wafers 100 are removed by etching to the etch stop 112.

FIG. 9 depicts a simplified cross section of an embodiment of the III-V wafer 100 secured to the transfer wafer 300 after applying photoresist 904. UBM (under-bump metallization) photoresist is applied for a UBM mask. For example, PMGI/LOR bilayer, or negative resist, is used to generate liftoff undercut 908.

Figure 10:
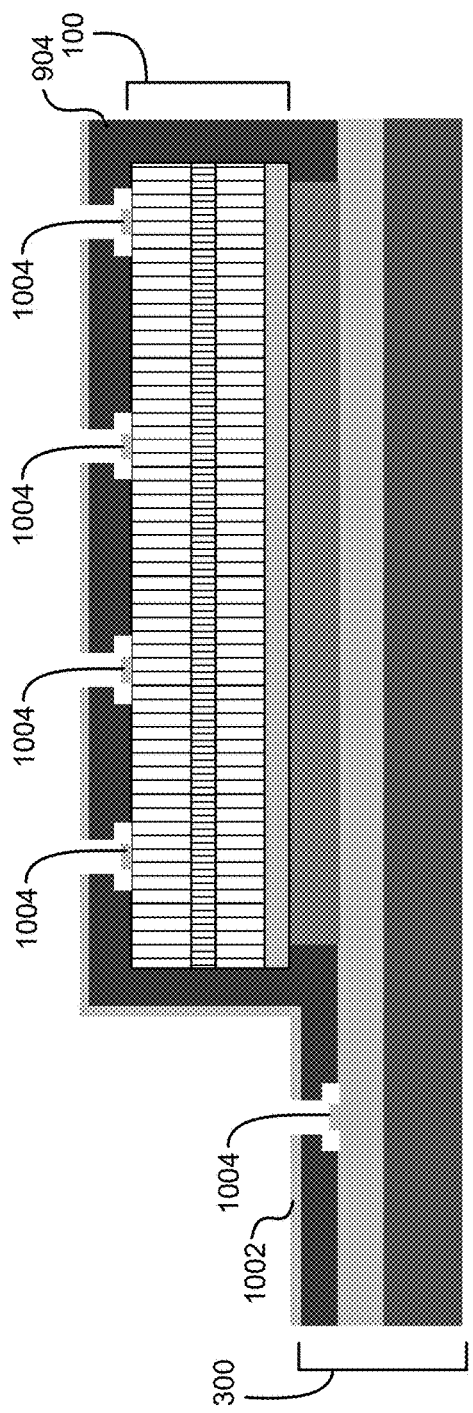
FIG. 10 depicts a simplified cross section of an embodiment of the III-V wafer secured to the transfer wafer after applying a metal to the III-V wafer.

FIG. 10 depicts a simplified cross section of an embodiment of the III-V wafer 100 secured to the transfer wafer 300 after applying a metal 1002 to the III-V wafer 100 to form pads 1004 on the III-V wafer 100. In some embodiments, the metal 1002 is a UBM metal stack. In some embodiments, the UBM metal stack may vary depending on III—V type and contact requirements.

Figure 11:
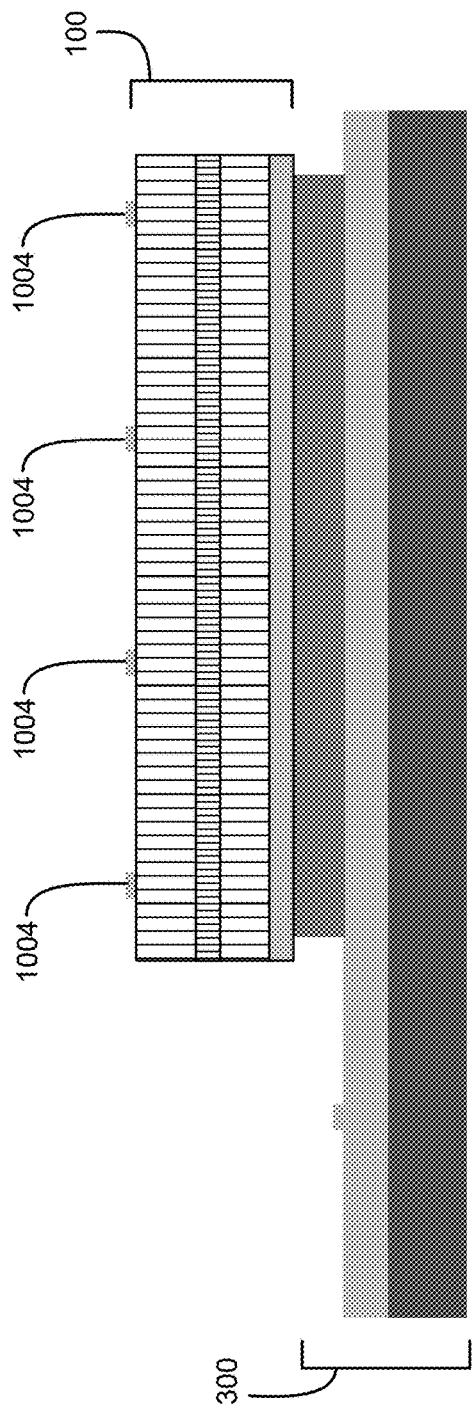
FIG. 11 depicts a simplified cross section of an embodiment of the III-V wafer secured to the transfer wafer after removing the photoresist.

FIG. 11 depicts a simplified cross section of an embodiment of the III-V wafer 100 secured to the transfer wafer 300 after removing the photoresist 904. The UBM mask is lifted off. In some embodiments, the UBM mask is lifted off using a solvent-based liftoff.

Figure 12:
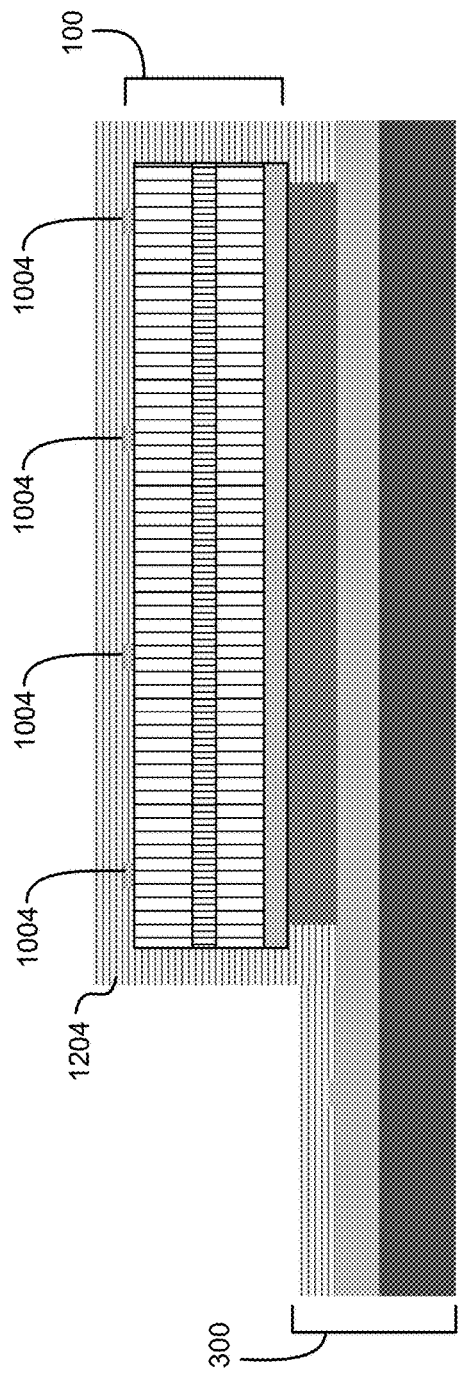
FIG. 12 depicts a simplified cross section of an embodiment of the III-V wafer secured to the transfer wafer after applying a hard mask.

FIG. 12 depicts a simplified cross section of an embodiment of the III-V wafer 100 secured to the transfer wafer 300 after applying a hard mask 1204. A hard mask 1204 is applied to the III-V wafer 100. In some embodiments, the hard mask 1204 is a low temperature SiO2 (meaning that SiO2 is applied at a low temperature). In some embodiments, low temperature is from 50° C. to 250° C., or from 90° C. to 210° C. (e.g., 200° C., 150° C., or 100° C.). In some embodiments, the hard mask 1204 is between 0.5 and 2.0 μm thick (e.g., 1 μm). In some embodiments, a low temperature is used so stress between layers is reduced (e.g., the higher the temperature, the higher the thermal mismatch between layers, and the higher the stress between the layers). In some embodiments, the hard mask 1204 isn't used. For example, a hard mask 1204 is used for InP, but a hard mask 1204 isn't used for GaAs. In some embodiments, InP is used for telecom applications (e.g., for a laser wavelength between 1.2 and 1.6 μm).

Figure 13:
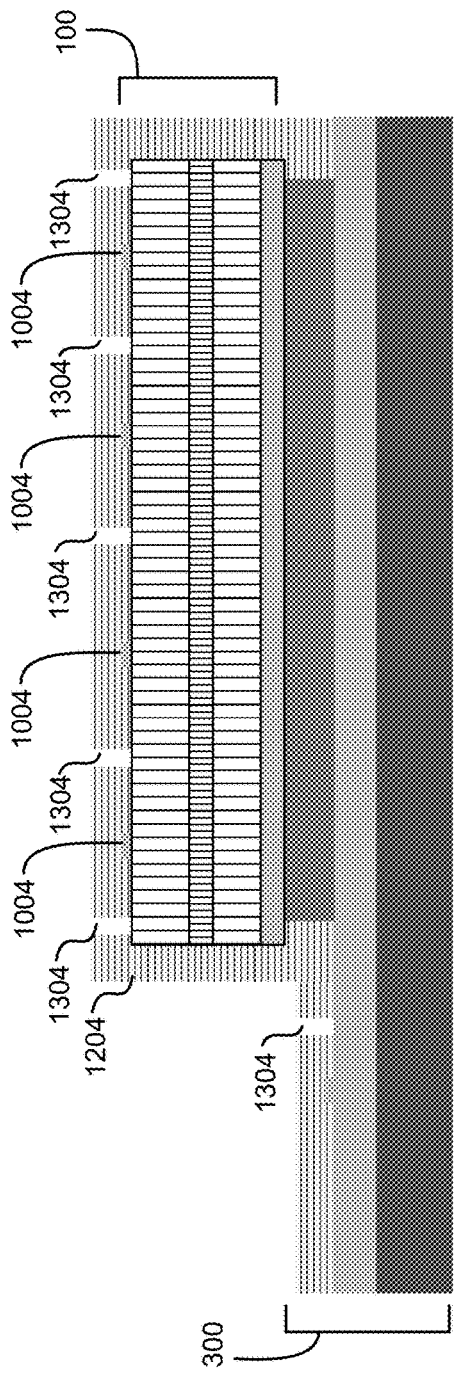
FIG. 13 depicts a simplified cross section of an embodiment of the III-V wafer secured to the transfer wafer after forming trenches in the hard mask.

FIG. 13 depicts a simplified cross section of an embodiment of the III-V wafer 100 secured to the transfer wafer 300 after forming trenches 1304 in the hard mask 1204. Trenches 1304 are defined by walls in the hard mask 1204. The trenches 1304 are formed by patterning and then trenching the hard mask 1204. For example, patterns are formed on the hard mask 1204 using photolithography. After trenching, photoresist is cleared and the transfer wafer 300 and/or the III-V wafers 100 are cleaned.

Figure 14:
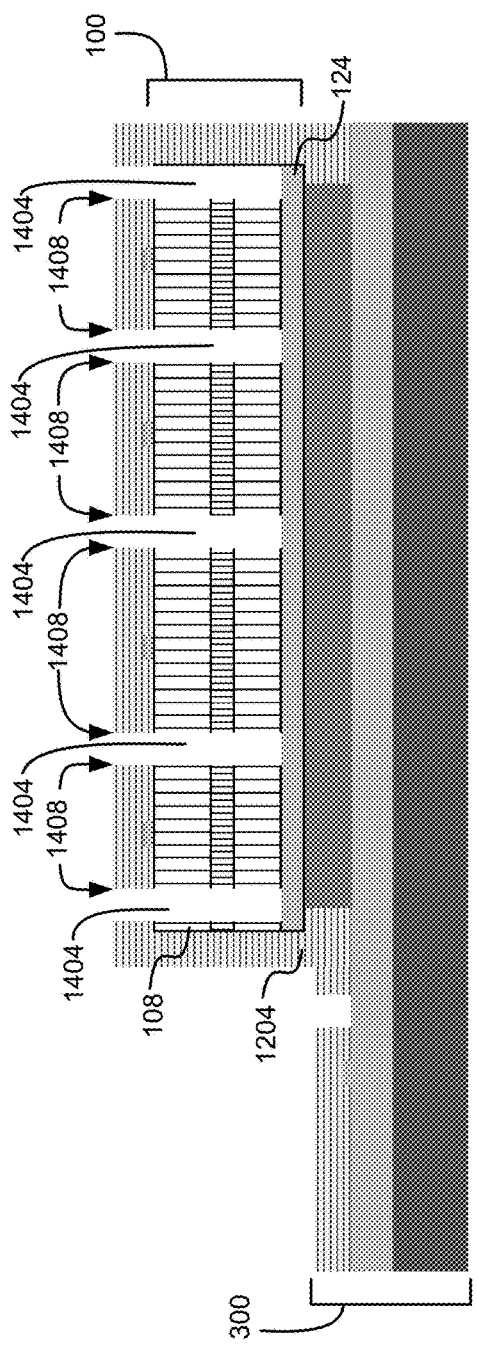
FIG. 14 depicts a simplified cross section of an embodiment of the III-V wafer secured to the transfer wafer after forming trenches in the front side of the III-V wafer.

FIG. 14 depicts a simplified cross section of an embodiment of the III-V wafer 100 secured to the transfer wafer 300 after forming trenches 1404 in the front side 108 of the III-V wafer 100. Trenches 1404 are defined by walls, sometimes referred to as facets 1408, in the III-V wafer 100. The facets 1408 are etched facets, not cleaved facets. In some embodiments, an etched facet is not as smooth as a cleaved facet. The front sides 108 of III-V wafers 100 are etched to form chips. The front sides 108 of the III-V wafers are etched through trenches 1304 in the hard mask 1204. The etching stops on the front layer 124 (in some embodiments, a dielectric layer).

Since facets 1408 are etched and not cleaved, chip size can be more precisely defined. The limitation on chip size is a photolithography tolerance (e.g., better than 0.1 μm with a precise stepper/scanner), while cleaving/dicing has 20 to 50 μm registration inaccuracy. Thus in some embodiments, the chip size (e.g., a length and/or a width) is equal to or less than 20, 15, 10, or 5 μm and equal to or greater than 0.1, 0.5, 1.0, or 2.0 μm. Further, chips can be made in nearly any shape. In dicing, chips are normally limited to a parallelogram shape (e.g., rectangular). Using photolithography to define chips, chips can have shapes that are non-parallelogram (e.g., non-rectangular). For example, facets 1408 could be curved (e.g., curved as looking from a top view) to focus or diffuse light exiting the facet 1408. In some embodiments, the chip is round. In some embodiments, chip shape is quadrilateral and not a parallelogram (e.g., four sides of unequal lengths and not parallel; a trapezoid with only two sides that are parallel; or a kite). In some embodiments, a chip has three, five, six, seven, eight, and/or nine sides. In some embodiments, a chip has a waveguide ridge formed along a crystal axis of the III-V chip while a facet 1408 of the III-V chip is not orthogonal to the waveguide ridge (e.g., to reduce reflection).

Figure 15:
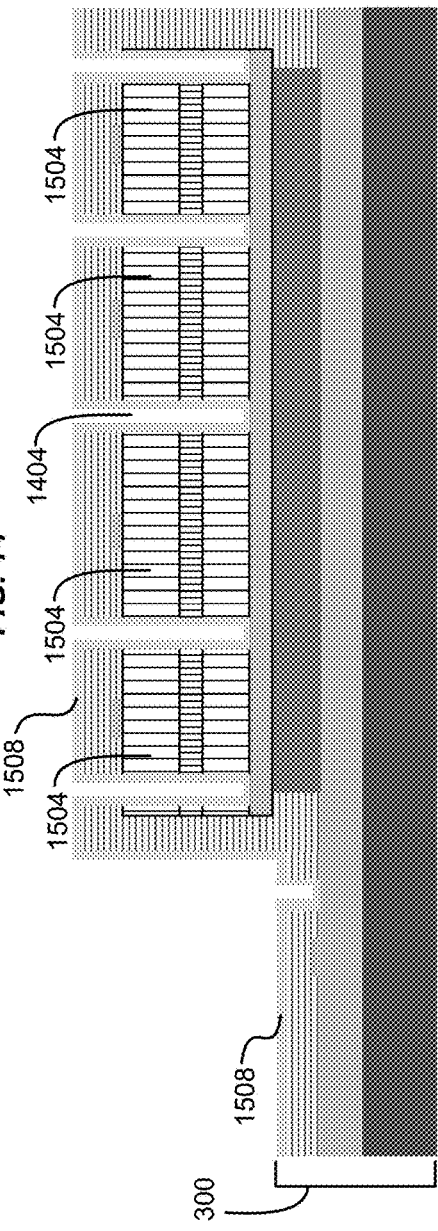
FIG. 15 depicts a simplified cross section of an embodiment of chips secured to the transfer wafer after applying a passivation layer.

FIG. 15 depicts a simplified cross section of an embodiment of chips 1504 secured to the transfer wafer 300 after applying a passivation layer 1508. The passivation layer 1508 is applied to the transfer wafer 300 and the chips 1504. The passivation layer 1508 coats sides of trenches 1404, and hence coats facets 1408. In some embodiments, the passivation layer 1508 is a dielectric. In some embodiments, the passivation layer 1508 is SiO2 or SiNx. In some embodiments, low-temperature deposition is used. In some embodiments, the passivation layer 1508 has a thickness between 0.1 μm and 0.5 μm (e.g., 0.2, 0.3, or 0.4 μm). In some embodiments, the passivation layer 1508 is applied to protect sides of chips 1504 (e.g., facets 1408) during later processing.

Figure 16:
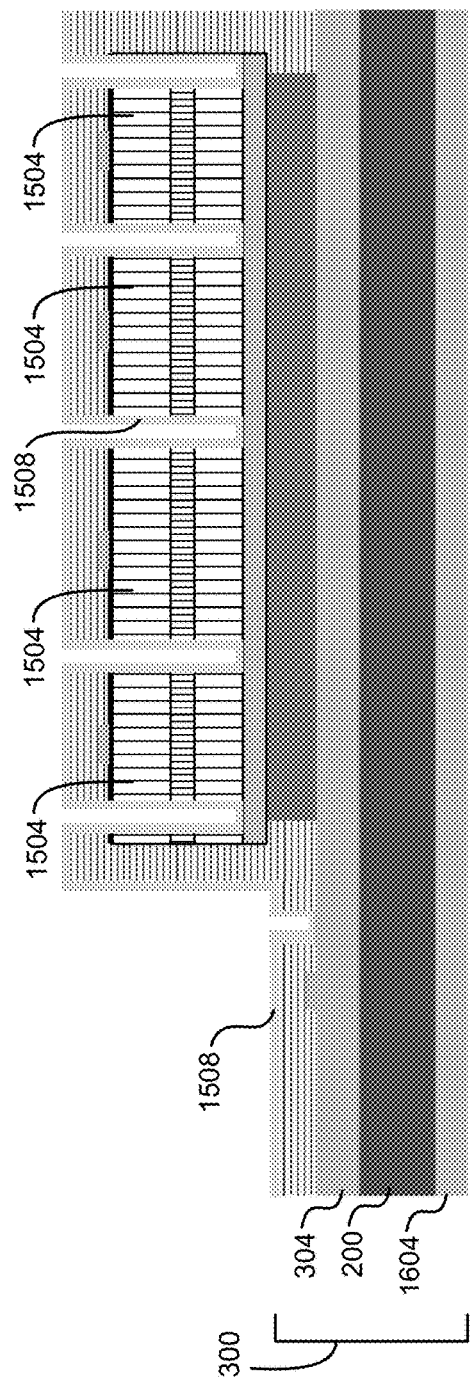
FIG. 16 depicts a simplified cross section of an embodiment of chips secured to the transfer wafer after applying a mask to the transfer wafer.

FIG. 16 depicts a simplified cross section of an embodiment of chips 1504 secured to the transfer wafer 300 after applying a mask 1604 to the transfer wafer 300. The mask 1604 is a hard mask (e.g., SiO2) and is applied (e.g., deposited) to the transfer substrate 200. In some embodiments, the mask 1604 is not used (e.g., if a fab can apply a thick photoresist for a Bosch etch, then a hard mask might not be used). In some embodiments, the SiO2 is a low temperature SiO2.

Figure 17:
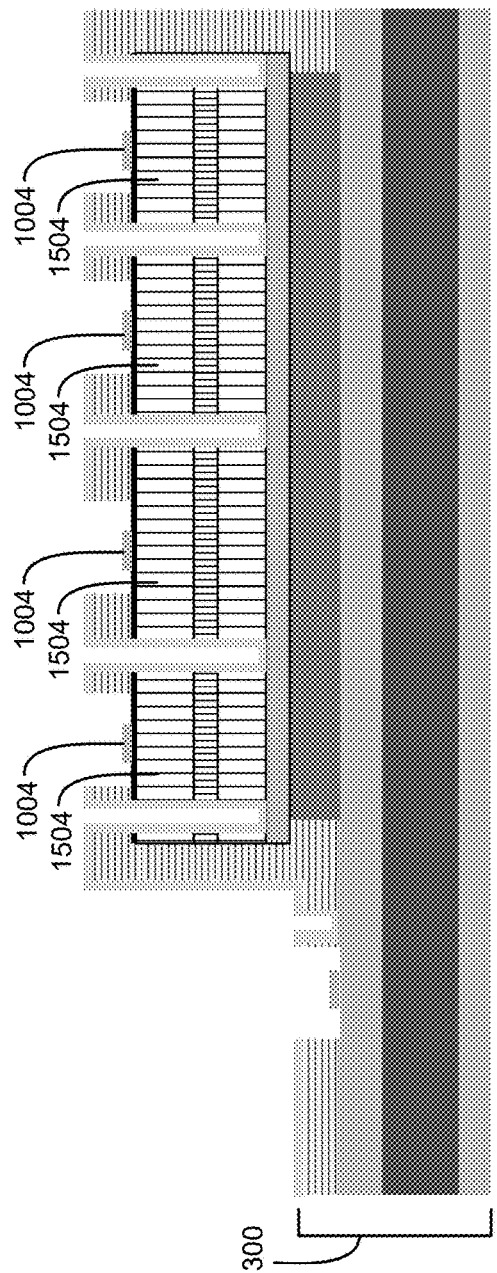
FIG. 17 depicts a simplified cross section of an embodiment of chips secured to the transfer wafer after exposing UBM pads.

FIG. 17 depicts a simplified cross section of an embodiment of chips 1504 secured to the transfer wafer 300 after exposing pads 1004 of the chips 1504. The pads 1004 are UBM pads. The pads 1004 are exposed by defining a pattern with photolithography, etching dielectric, stripping photoresist, and cleaning the III-V wafer 100 and/or the transfer wafer 300.

FIG. 18 depicts a simplified cross section of an embodiment of chips 1504 secured to the transfer wafer 300 after applying bond material 1804 to the chips 1504. The bond material 1804 is applied to the pads 1004. In some embodiments, the bond material 1804 is metal. In some embodiments, the bond material 1804 is a solder. In some embodiments, a liftoff lithography technique is used to deposit the bond material 1084. U.S. patent application Ser. No. 12/902,621, filed on Oct. 12, 2010, which is incorporated by reference for all purposes, provides an example of material for use as the bond material 1804.

FIG. 19 depicts a simplified cross section of an embodiment of chips 1504 secured to the transfer wafer 300 after removing a portion of the hard mask 1204. The hard mask 1204 is etched (e.g., using an anisotropic dielectric etch). Etching leaves spacers 1904 (of the passivation layer 1508), which help protect sidewalls (e.g., facets 1408) of chips 1504.

FIG. 20 depicts a simplified cross section of an embodiment of chips 1504 secured to the transfer wafer 300 after forming trenches in the adhesive 308. Trenches in the adhesive 308 are formed. For example, short solvent dissolution and/or an oxygen dry etch is used. In some embodiments, short solvent dissolution is immersing for 15 minutes to 90 minutes in solvent (e.g., 30 minutes to 60 minutes).

FIG. 21 depicts a simplified cross section of an embodiment of chips 1504 secured to the transfer wafer 300 after etching the mask 1604 of the transfer wafer 300. In some embodiments, the mask 1604 is etched, forming trenches 2104, using photolithography. Etching the mask 1604 on the transfer substrate 200 is performed by aligning to trenches (e.g., trenches 1304 and 1404) in the transfer wafer 300 (e.g., trenches 1304 in the stop layer 304) and/or in the III-V wafer 100.

Figure 22:
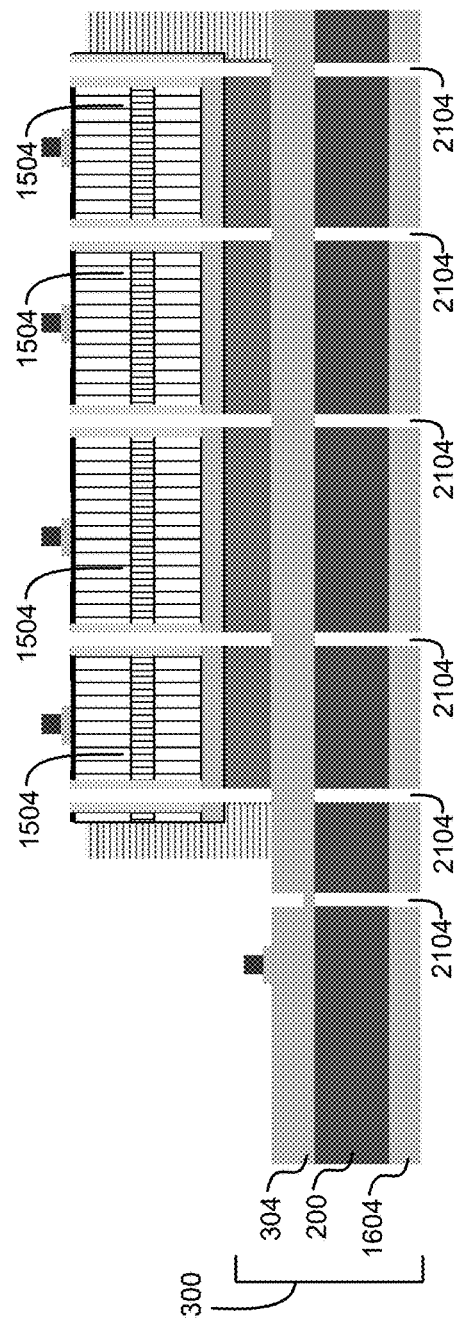
FIG. 22 depicts a simplified cross section of an embodiment of chips secured to the transfer wafer after etching the transfer substrate.

FIG. 22 depicts a simplified cross section of an embodiment of chips 1504 secured to the transfer wafer 300 after etching the transfer substrate 200. The transfer substrate 200 is etched through trenches 2104 in the mask 1604. Etching ends on the stop layer 304. In some embodiments, a Bosch etch is used. In some embodiments, the transfer substrate 200 is etched at least 50%, or 75%, and not all the way through the transfer substrate 200 (e.g., to provide more rigidity for handing the transfer substrate before singulation). In some embodiments, a Bosch etch process can be performed from through the trenches 1404 defined in the III-V wafer 100 and the adhesive 308. In some embodiments, thick photoresist is used as a mask for a pattern and transferring the pattern to the transfer substrate 200 using a Bosch etch technique.

Figure 23:
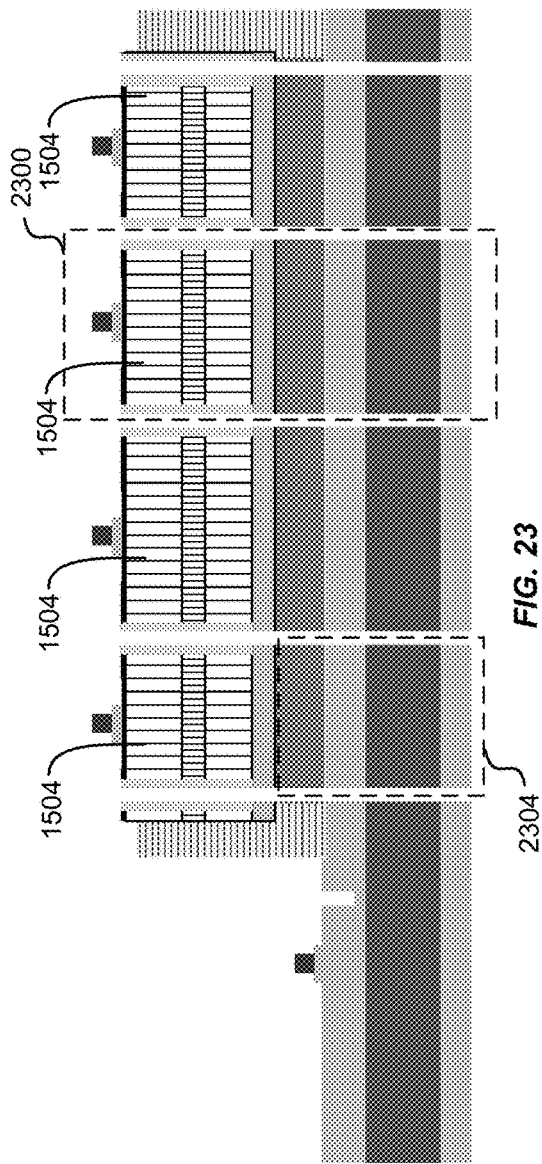
FIG. 23 depicts a simplified cross section of an embodiment of a chip unit.

FIG. 23 depicts a simplified cross section of an embodiment of chip units 2300. Chip units 2300 are singulated (e.g., by stretching on blue tape). A chip unit 2300 comprises a chip 1504 and a portion 2304 of the transfer wafer 300. Thus many chips 1504 can be generated on a silicon substrate (e.g., transfer substrate 200). In some embodiments, the chips 1504 are thin (e.g., equal to or greater than 1 μm and equal to or less than 10 μm, or 2 μm and 6 μm, thick). The chips 1504 are for bonding to silicon photonics. In some embodiments, a chip 1504 has a surface area (orthogonal to the thickness of the chip 1504) between 40,000 $\mu m^2$ and 1 million $\mu m^2$ (e.g., 500 μm×500 μm). The relatively small surface area allows for relative ease in removing the transfer substrate 200 by dissolving the adhesive 308.

Figure 24:
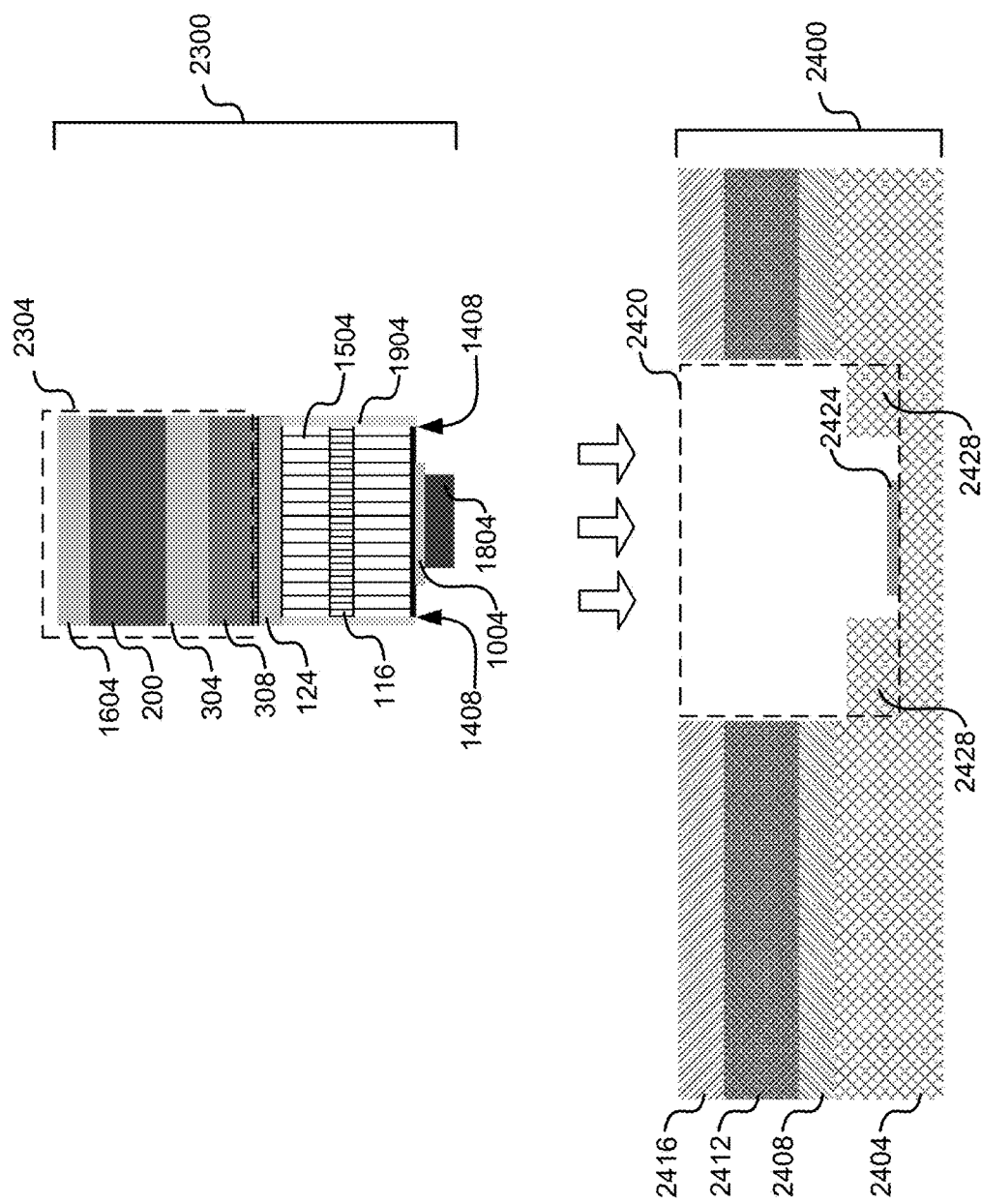
FIG. 24 depicts a simplified cross section of an embodiment of the chip unit before bonding to a silicon device.

FIG. 24 depicts a simplified cross section of an embodiment of the chip unit 2300 before bonding to a silicon device 2400. The chip unit 2300 is "flipped" so that the chip 1504 is below the portion 2304 of the transfer wafer 300. The silicon device 2400 comprises a device substrate 2404 (e.g., a handle portion of a silicon-on-insulator (SOI) wafer), a buried oxide (BOX) layer 2408 (e.g., SiO2 of the SOI wafer), a device layer 2412 (e.g., of the SOI wafer), and a cladding layer 2416. In some embodiments the cladding layer 2416 is SiO2. In some embodiments, the device layer 2412 is crystalline silicon and/or comprises optical and/or electrical components (e.g., an optical waveguide formed by etching the device layer 2412). In some embodiments, the device substrate 2404 is crystalline silicon.

In some embodiments, a silicon device is referred to as a target device. In some embodiments, materials other than silicon are used for the target device. For example, a lithium niobite could be used as a chip, and a III-V device (e.g., a laser) could be the target device. Thus preparing a chip in a chip could be done.

A pit 2420 (e.g., a recess) is formed in the silicon device 2400 for receiving the chip 1504. The pit is defined by walls in the device substrate 2404, the BOX layer 2408, the device layer 2412, and/or the cladding layer 2416; as well as a floor in the device substrate 2404. On the floor of the pit 2420 is a pad 2424 used in bonding the chip 1504 to the silicon device 2400. In some embodiments, the pad 2424 is similar to pad 1004. In some embodiments, the bond material 1804 is placed on pad 2424 in addition to, or in lieu of, placing the bond material 1804 on pad 1004.

In some embodiments, the pit 2420 comprises pedestals 2428 (e.g., defined in the device substrate 2404) used for aligning the active region 116 of the chip 1504 with the device layer 2412 of the silicon device 2400 (e.g., to optically align; to butt-couple the active region 116 with a waveguide in the device layer 2412).

Figure 25:
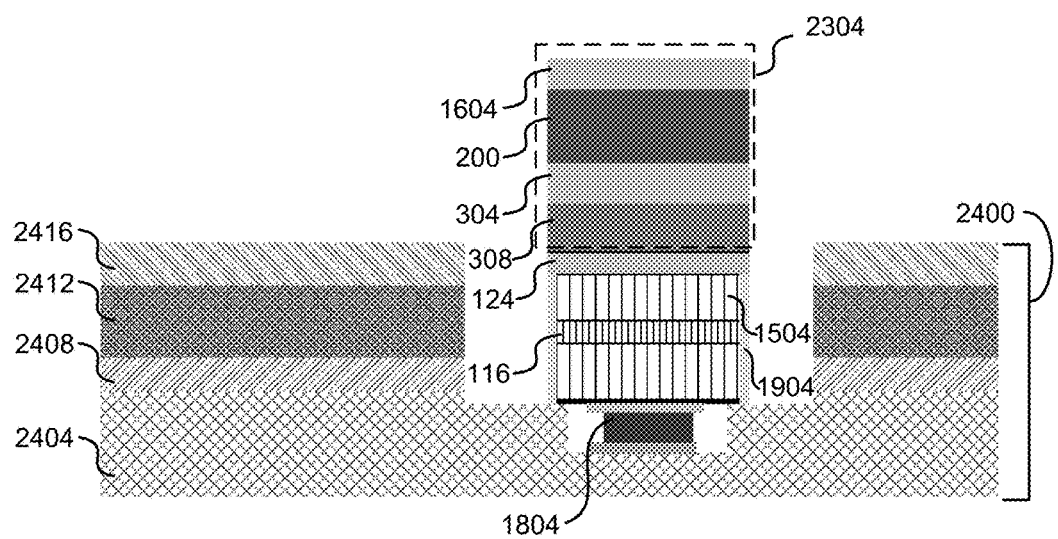
FIG. 25 depicts a simplified cross section of an embodiment of the chip unit after bonding to the silicon device.

The chip 1504 is bonded in the pit 2420 of the silicon device 2400. FIG. 25 depicts a simplified cross section of an embodiment of the chip unit 2300 after bonding to the silicon device 2400. Bond material 1804 bonds the chip 1504 to the floor of the pit 2420 of the silicon device 2400. In some embodiments, the portion 2304 of transfer wafer 300 is used as a handle for placing and/or aligning the chip 1504 in the pit 2420 of the silicon device 2400. U.S. patent application Ser. No. 14/509,914, filed on Oct. 8, 2014, which is incorporated by reference for all purposes, describes bonding III-V chips to silicon devices (platforms).

Figure 26:
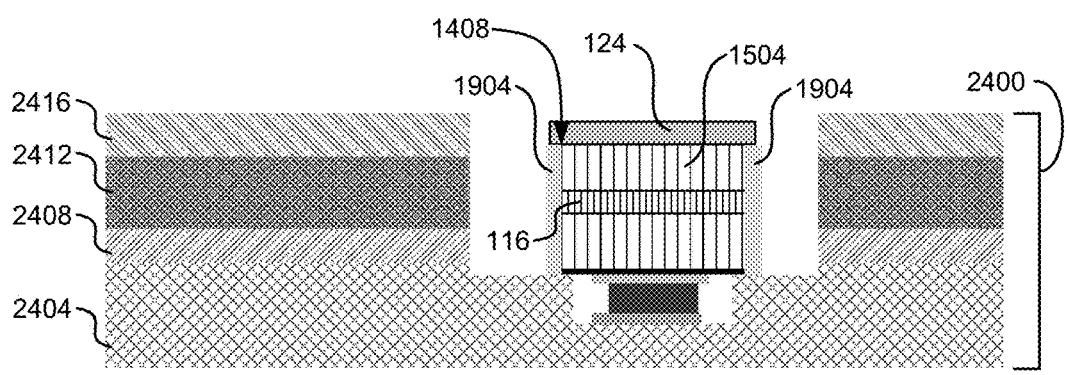
FIG. 26 depicts a simplified cross section of a composite semiconductor device.

FIG. 26 depicts a simplified cross section of a composite semiconductor device. The portion 2304 of the transfer wafer 300 is removed from the chip 1504. In some embodiments, the portion 2304 of the transfer wafer 300 is removed by a soak in solvents. In some embodiments, a long soak is used. A long soak is from 3 hours to 10 hours, or 5 hours to 8 hours. The adhesive 308 is dissolved and the transfer substrate 200 is detached from the chip 1504. In some embodiments, the portion 2304 of the transfer wafer 300 and/or the silicon device 2400 are immersed in solvent (e.g., vertically; or horizontally, "upside-down" so that the portion 2304 of the transfer wafer 300 drops as the adhesive 308 is dissolved).

Spacers 1904 are on sidewalls (e.g., facets 1408) of the chip 1504 to help protect the chip 1504 (e.g., the active region 116 of the chip 1504) when forming an optical bridge (e.g., an optical coupler) between the chip 1504 and the device layer 2412 of the silicon device 2400. Examples of forming an optical bridge are given in U.S. Pat. No. 9,097,846, issued on Aug. 4, 2014; and U.S. patent application Ser. No. 15/426,366, filed on Feb. 7, 2017, which are incorporated by reference.

Figure 27:
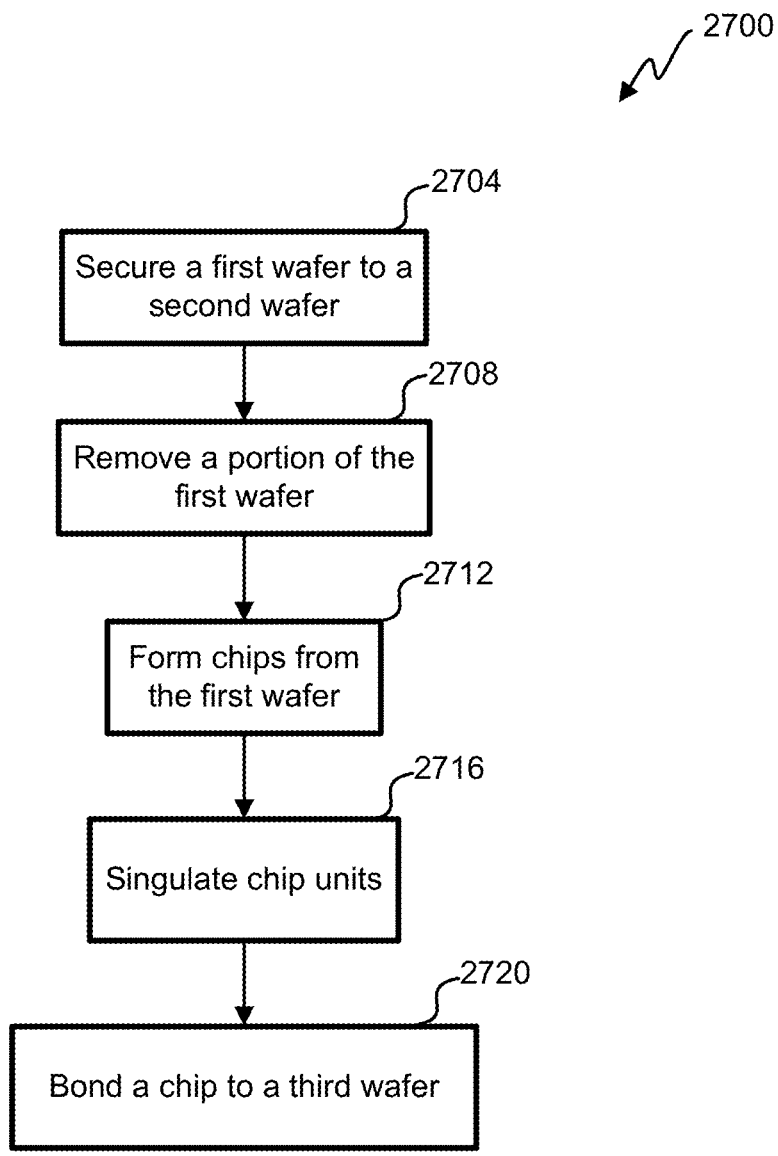
FIG. 27 depicts a flowchart of an embodiment of a process for creating a semiconductor laser.

Referring to FIG. 27, a flowchart of an embodiment of a process 2700 for creating a semiconductor laser is shown. Process 2700 begins in step 2704 with securing a first wafer to a second wafer. In some embodiments, the first wafer is the III-V wafer 100 and the second wafer is the transfer wafer 300. In some embodiments, an adhesive (e.g., adhesive 308) is applied to the transfer substrate 200 to form the transfer wafer 300. In some embodiments, the first wafer is secured to the second wafer by contacting the first wafer to the adhesive 308. In some embodiments, the adhesive is applied to the first wafer. In some embodiments, more than one wafer is secured to the second wafer (e.g., see FIG. 5).

In step 2708, a portion (e.g., the back side 104) of the first wafer is removed. In some embodiments, the portion removed from the first wafer is a substrate of the first wafer (e.g., InP or GaAs). In some embodiments, the substrate of the first wafer is removed after securing the first wafer to the second wafer and/or before forming chips in the first wafer so that sides (e.g., facets 1408) of chips are protected from chemicals used in removing the substrate of the first wafer.

In step 2712, chips (e.g., chips 1504) are formed from the first wafer. In some embodiments, chips are formed in the first wafer by etching the first wafer and/or other wafers secured to the transfer wafer 300 (e.g., etching trenches as described with FIG. 14). In some embodiments, a spacer 1904 is applied to facets 1408 to protect the facets 1408 during later processing (e.g., see FIG. 15). In some embodiments, UBM pads (e.g., pads 1004) and/or material for bonding (e.g., bond material 1804) is applied to the chips. Applying UBM pads and/or material for bonding is performed at the wafer level, and in some embodiments, for several III-V wafers at once to more quickly produce chips 1504 that are ready for bonding.

In step 2716, chip units (e.g., chip unit 2300) are singulated. A chip unit comprises a chip formed from the first wafer and a portion of the second wafer. In some embodiments, chip units are singulated by etching trenches in the transfer substrate 200 and/or the stop layer 304 (e.g., see FIGS. 22 and 23).

In step 2720, a chip of the plurality of chips is bonded to a third wafer. A chip is aligned with the third wafer using the portion of the second wafer as a handle to move the chip. In some embodiments, the third wafer is the silicon device 2400. After bonding, the portion of the second wafer is removed from the chip. In some embodiments, the portion of the second wafer is removed by removing (e.g., dissolving) the adhesive 308.

In some embodiments, an optical bridge is formed to couple the active region 116 of a chip 1504 with the device layer 2412 of the silicon device 2400. Examples of III-V chips integrated with silicon devices to form a semiconductor laser include U.S. Pat. No. 8,615,025, issued on Dec. 24, 2013; U.S. Pat. No. 9,316,785, issued on Apr. 19, 2016; U.S. Pat. No. 9,252,564, issued on Feb. 2, 2016; and U.S. patent application Ser. No. 15/426,823, filed on Feb. 7, 2017.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, other steps, such as kerf lanes, can be added to process 2700. In some embodiments, manufacturing costs can be reduced by using techniques described in this disclosure for materials that are available on smaller wafers than silicon wafers (e.g., 1, 2, 3, or 4 inches) that are to be bonded to silicon wafers, regardless of whether an optical bridge is formed. For example, a VCSEL (vertical-cavity surface-emitting laser), with no optical bridge into the target device (e.g., silicon), could be bonded to the silicon device 2400. In some embodiments, methods disclosed enable scaling and manufacturing cost reductions of "non-silicon" material (e.g., III-V, garnet, lithium niobite, etc.). Thus non-silicon material could have any shape and/or size defined by photolithography and etch. Very small and/or any shape material could be bonded on silicon devices in an area where a depth of a pit 2420 in the target device is less than the thickness of the "non-Silicon" material (the depth of the pit 2420 could be zero). In some embodiments, etching features other than trenches is performed and/or etching the transfer substrate 200 is not aligned with etching trenches 1404 in the III-V wafer. For example, etching can be used to make a chip 1504 smaller than a portion of the substrate 2304 and/or to make the chip 1504 in any shape (e.g., any shape as allowed by etching). The portion of the substrate 2304 can be large enough to be used as a handle, and the chip 1504 can be small to fit in a pit 2420 having a cross section smaller than the portion of the substrate.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged and steps can be omitted. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

Patents, patent applications, publications, and descriptions mentioned are incorporated by reference in their entirety for all purposes. None is admitted to be prior art.

What is claimed is:

1. A method for creating a composite semiconductor laser by bonding a gain chip to a silicon device, the method comprising:
   applying an adhesive to a transfer substrate to form a transfer wafer;
   securing a device wafer to the transfer wafer by contacting the device wafer to the adhesive;
   removing a portion of the device wafer after securing the device wafer to the transfer wafer;
   etching trenches in the device wafer to form a plurality of chips, wherein etching trenches is performed after removing the portion of the device wafer;
   etching trenches in the transfer substrate to singulate a chip unit, wherein the chip unit comprises:
      a chip of the plurality of chips, and
      a portion of the transfer wafer;
   aligning the chip with a target device after singulating the chip unit, wherein the portion of the transfer wafer is used as a handle to align the chip with the target device;
   bonding the chip to the target device; and
   removing a portion of the adhesive to disconnect the portion of the transfer wafer from the chip.

2. The method as recited in claim 1, wherein:
   the device wafer is a III-V wafer, and
   the target device is a silicon device.

3. The method as recited in claim 1, wherein:
   the target device comprises:
      a device substrate comprising silicon, the device substrate forming a floor,
      a device layer comprising silicon, wherein:
         the device layer forms walls,
         a recess in the target device is defined by the floor and the walls, and
         an optical waveguide is formed in the device layer;
   aligning the chip with the silicon device comprises aligning the chip with the recess of the target device;
   the chip comprises:
      a facet, and
      an active region,
      the facet is an etched facet; and
   the active region of the chip is optically aligned with the optical waveguide in the device layer such that the composite semiconductor laser is configured to guide an optical beam from the active region of the chip, through the facet of the chip, through a wall of the device layer, and into the optical waveguide.

4. The method as recited in claim 1, wherein etching the transfer substrate is performed after etching trenches in the device wafer.

5. The method as recited in claim 1, further comprising forming trenches in the adhesive.

6. The method as recited in claim 1, wherein:
   the device wafer comprises a back side, a front side, and an etch stop dividing the front side from the back side,
   the back side is a III-V substrate,
   the front side comprises an active region,
   the active region is a multi-quantum well structure, and
   removing the portion of the device wafer removes the back side of the device wafer.

7. The method of claim 1, further comprising applying a stop layer, wherein the stop layer is between the transfer substrate and the adhesive.

8. The method of claim 1, further comprising applying a passivation layer after etching trenches in the device wafer.

9. The method of claim 1, further comprising applying bond material to pads on the device wafer before singulating the chip unit.

10. The method of claim 1, wherein the device wafer is a first wafer and the method further comprises:
    securing a second wafer to the adhesive,
    removing a portion of the second wafer after securing the second wafer to the adhesive, and
    etching trenches in the second wafer to form the plurality of chips, wherein etching trenches in the second wafer is performed after removing the portion of the second wafer.

11. A method for creating a composite semiconductor device, the method comprising:
    securing a first wafer to a transfer wafer;
    securing a second wafer to the transfer wafer;
    removing a portion of first wafer;
    removing a portion of the second wafer;
    etching the first wafer and the second wafer to form a plurality of chips, wherein etching is performed after removing the portion of the first wafer and after removing the portion of the second wafer;
    etching the transfer wafer to singulate a chip unit, wherein the chip unit comprises:
       a chip of the plurality of chips, and
       a portion of the transfer wafer;
    bonding the chip to a target device after singulating the chip unit, wherein the portion of the transfer wafer is used as a handle to align the chip with the target device; and
    removing the portion of the transfer wafer from the chip.

12. The method of claim 11, wherein removing the portion of the first wafer and removing the portion of the second wafer are performed concurrently.

13. The method of claim 11, further comprising forming an optical bridge to optically couple an active region of the chip to a waveguide in the target device.

14. The method of claim 11, further comprising applying metal to the first wafer and to the second wafer to form under-bump metallization pads on the first wafer and on the second wafer, wherein applying the metal is performed after securing the first wafer and the second wafer to the transfer wafer.

15. The method of claim 11, further comprising:
    applying a dielectric layer to the first wafer, and
    securing the first wafer to the transfer wafer by contacting the dielectric layer of the first wafer to an adhesive on the transfer wafer.

* * * * *